Figure 1:
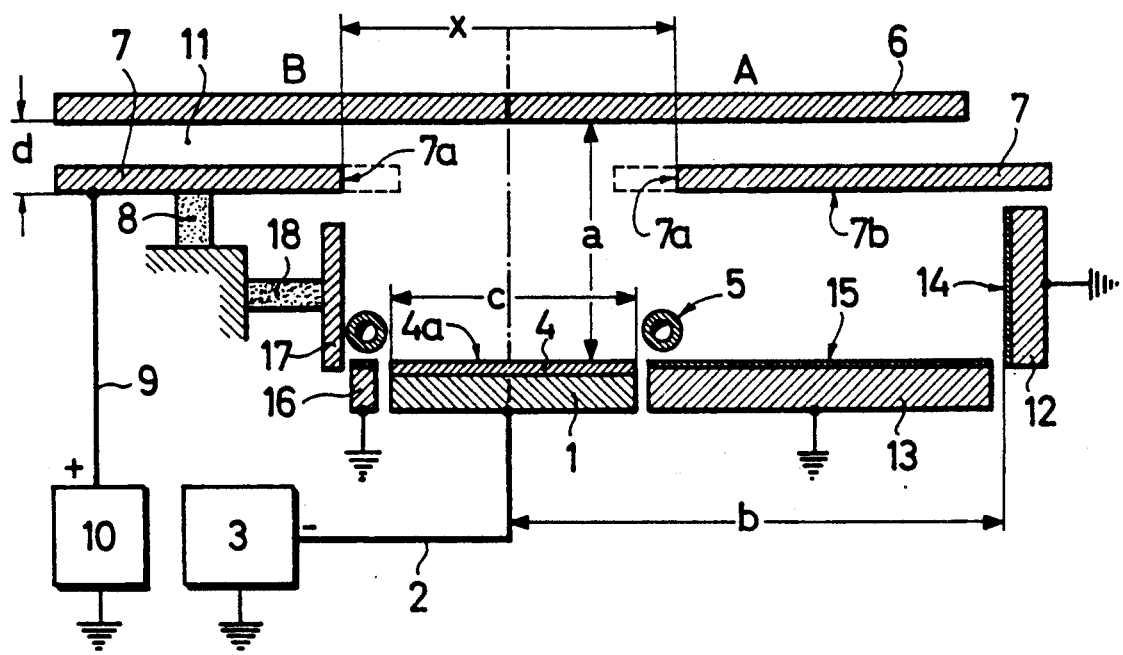

United States Patent [19]

Wirz

[11] Patent Number: 4,988,422

[45] Date of Patent: Jan. 29, 1991

[54] PROCESS AND APPARATUS FOR DEPOSITING COATINGS OF HIGH ELECTRICAL RESISTANCE BY CATHODE SPUTTERING

[75] Inventor: Peter Wirz, Waldernbach, Fed. Rep. of Germany

[73] Assignee: Leybold Aktiengesellschaft, Hanau, Fed. Rep. of Germany

[21] Appl. No.: 59,067

[22] Filed: Jun. 8, 1987

[30] Foreign Application Priority Data

Mar. 20, 1987 [DE] Fed. Rep. of Germany ....... 3709175

[51] Int. Cl.$^5$ ............................................. C23C 14/34
[52] U.S. Cl. ........................... 204/192.15; 204/192.21; 204/298.06; 204/298.07; 204/298.11
[58] Field of Search ...................... 204/192.12, 192.15, 204/192.26, 192.29, 298, 192.21, 298.07, 298.11, 298.06, 298.16, 298.19, 298.23, 298.24

[56] References Cited

U.S. PATENT DOCUMENTS

| | | | |
|---|---|---|---|
| 4,094,764 | 6/1978 | Boucher et al. | 204/298 |
| 4,278,528 | 7/1981 | Kuehnle et al. | 204/298 |
| 4,392,931 | 7/1983 | Maniv et al. | 204/298 X |
| 4,428,809 | 1/1984 | Heimbach et al. | 204/298 X |
| 4,572,842 | 2/1986 | Dietrich et al. | 204/298 X |

*Primary Examiner*—Nam X. Nguyen
*Attorney, Agent, or Firm*—Felfe & Lynch

[57] ABSTRACT

Apparatus for reactive sputtering of an electrically resistive coating onto a planar substrate includes a magnetron cathode with a planar target of a metal which forms one component of the coating. The reaction gas, which provides another component of the coating, is released as close as possible to the target, but outside of its outline. The distance "a" between the target surface and the substrate surface is less than 60 mm, and a mask system is provided at a distance "d" from the substrate which is less than half the distance "a". The density of reaction gas particles in front of the substrate is thus increased, resulting in a high deposition rate.

23 Claims, 2 Drawing Sheets

PROCESS AND APPARATUS FOR DEPOSITING COATINGS OF HIGH ELECTRICAL RESISTANCE BY CATHODE SPUTTERING

The present invention relates to sputtering electrically resistive coatings. More particularly, the present invention relates to sputtering such coatings using a magnetron cathode supplied with direct current, continuous delivery of relative gas, and a masking system between target and substrate.

Whereas the depositing of metallic coatings of low electrical resistance involves but slight problems, the production of coatings of high resistance is relatively problematical because, as the process continues, metal parts of the apparatus, which have to have certain potential differences from one another, become increasingly coated with the high-resistance coating material, and this coating also spreads out over large areas. The result is a drifting of the process parameters which makes the coating process unstable, so that the products made by the process have properties that vary with the duration of the process. The term, "coatings of high electrical resistance," is to be understood to mean those with specific resistance greater than $5 \times 10^{-4}$ ohms/cm, but this limit is not critical and can be evaluated differently from case to case. Such coatings already have the properties of insulating coatings on surfaces on which the scattered particles condense.

The reaction gas can be, for example, a pure reaction gas such as oxygen or nitrogen, or a mixture of at least one of these gases with an inert gas such as argon which is needed for the sputtering process.

To be able to run the sputtering process on direct current, the target must be electrically conductive; it generally consists of a metal which forms the one component of the reaction that is to produce the coating, while the other reaction component originates from the reaction gas. The deposit of the desired compounds on the substrate is accomplished by the cooperation of metal vapor stream and reaction gas. The reaction gas, however, acts also on the target surface and there produces over a more or less large area of the target an insulating coating by which the sputtering rate is reduced and the stability of the process is impaired. In general, only the erosion pit which runs within the tunnel of magnetic lines of force confining the plasma discharge, and which is typically found in magnetron cathodes, is kept largely free of the insulative coating. At the bottom of the erosion pit, in any practical conduct of the process, the sputtering rate is so great that no interfering insulative coating can form. However, in this case attention must be paid to a number of additional process parameters.

In order to achieve adequate stability of the process, it is generally performed with a great decoupling between the substrate and the target. If decoupling is high, because of the ratio between the substrate area and the effective target area (area of the erosion pit on the target), the effect of the reaction gas on the substrate is increased relative to the effect on the target. A great decoupling is achieved, among other ways, by providing a great distance between target and substrate, which is usually about 100 mm.

Another decoupling means is to separate the points of entry of the working gas (e.g., argon) and the reaction gas, the working gas being admitted close to the target and the reaction gas (or a mixture of working gas and reaction gas) in the vicinity of the substrate. A relatively high process stability is achieved if additionally a diaphragm is introduced between the points of admission of the gases in order to separate the area close to the substrate from the area close to the target. This diaphragm acts on the one hand as an additional getter surface for the reaction gas in the area close to the target. The introduction of reaction gas into the area close to the target is thereby reduced and at the same time the effect of the reaction gas on the substrate is increased. Especially when applying insulating coatings and using a diaphragm the discharge current must be sustained by an additional anode which is disposed on the side of the diaphragm facing the substrate (DE-OS No. 33 31 707).

The known solutions, however, lead to technical problems. For example, the rates of deposit that can be achieved are considerably reduced due to the great distance between target and substrate, but especially on account of the fact that about 60% of the sputtered target material strikes the diaphragm. Furthermore, the density of the plasma in the area close to the substrate is also markedly reduced by the diaphragm. Consequently, a great excess of reaction gases must be used, which is diametrically opposed to the need to improve process stability by keeping the reaction gas away from the target. Since certain coating properties can furthermore be achieved only by a strong plasma action, the known solution is particularly unsuitable also for ion-supported coating. The known apparatus is also prone to disturbances since coatings grow on the diaphragm and flake off, especially when insulating coatings are involved.

The object of the invention is therefore to develop a process of the kind described, whereby insulative coatings or electrically resistive coatings can be deposited at high rates with great process stability.

The stated object is achieved by the invention through the measures described in the specific part of claim 1.

These measures, in contrast to the state of the art, lead to an extremely great coupling between the reaction gas and target, on the one hand, and the target and substrate on the other, and this is achieved especially by disposing the gas inlet close to the target and by the close substrate spacing. However, the attainment of high deposit rates is helpful to the solution of the problem, and it is accomplished by the fact that the process is performed virtually without a diaphragm. The opening in the mask is to be made so large that most of the particle stream can pass through it. The opening in the mask virtually no longer acts as a diaphragm when it corresponds approximately to the width of the target or is even larger.

It is therefore especially desirable to make the distance "x" between the inner margins of the mask between 0.6 and 2.0 times the cross dimension "c" of the target.

In the case of a circular target, the cross dimension "c" is the diameter of the target, and the distance "x" corresponds to the inside diameter of the mask. This coordination can easily be transferred to rectangular targets in which the inside margins of the mask then run parallel to one another at the interval "x."

By the dimensioning referred to above it is brought about that at least 60% of the particle stream can flow unhampered in the direction of the substrate.

It is especially advantageous if the mask which, in one specific type of operation, serves also as an anode, is disposed in the immediate vicinity of the plane of the substrate. In this case it is especially advantageous if the distance "d" between the mask surface facing the target and the substrate corresponds to no more than the sum of the thickness of the mask and corresponds to a gap with a width of 5 mm. Thus the plasma can act virtually unhampered and with a high density on the substrate or on the coating building up thereon.

In the procedure according to the invention, the discharge current cannot reach the dark space shield or the plasma diaphragm that is usually present, but is carried away in the vicinity of the substrate. Thus the plasma density in the area close to the substrate increases. As a result, the reaction gas is more effectively utilized, i.e., in comparison to the procedure with a decoupling, far less reaction gas is needed in order to achieve a particular degree of reaction. Contrary to all former teaching, by this configuration of the potential conditions in the area of the mask or anode, an increase in the basic stability of the discharge is surprisingly achieved.

A very decided advantage in proceeding according to the invention is the gain of a long-term constancy of the coating parameters and hence of the coating properties. In the reactive depositing of compounds or resistive coatings it is inevitable that insulative coatings will deposit themselves on the mask or other parts of the apparatus in the vicinity of the reaction zone. Since such parts as a rule are made of electrically conductive metal, the potential distribution varies while the coating is in progress. Thus, the active anode virtually shifts in the course of time from the vicinity of the cathode to that of the substrate. Depending on the rate of deposit and the thickness of the coating, these shifts take from a few minutes to more than an hour. The effects on the coating properties of such a change in the potential conditions are unacceptable.

It is true that even in the process according to the invention coating material condenses on the mask system, yet by conducting the process according to the invention it is brought about that these influences have no harmful effect on the long-term stability of the process parameters. This is because definite potential conditions that are optimum for the coating process are achieved from the outset.

It is especially advantageous to adjust the suction power of a vacuum pumping system that determines the vacuum on the one hand and the flow of the reaction gas per unit of time on the other such that less than one-third, preferably less than one-fifth, of the input reaction gas will be removed unused from the reaction zone between target and substrate.

This measure too is contrary to the teaching of the state of the art in which regularly more than half of the reaction gas input, in most cases even a multiple of the reaction gas input, is withdrawn through the vacuum pumps.

The ratio of the reaction gas input to the amount of reaction gas that is withdrawn unused can be very easily controlled by selecting the right gap width between the substrate and an inner housing surrounding the cathode. It can thus be brought about that the difference between the total pressures in the said inner housing and in the vacuum chamber surrounding the inner housing will be small against a factor of 2.

As already stated, these measures are contrary to the teaching of the state of the art, in which it is always stated that the process stability is to be increased by increasing the suction capacity of the vacuum pumps on the one hand and by increasing the input flow of reaction gas, which basically amounts to saying that the throughput of reaction gas is increased, with the result that only a small portion of the reaction gas is converted to the desired chemical compounds.

Increasing the suction capacity of the vacuum pumping system leads, however, leads to another difficulty, namely to a limitation of the condensation rate in the case of coatings with a high degree of reaction, or, at a given condensation rate, to a limitation of the degree of reaction. It is assumed that the reason for this is that, with an increase in the reaction gas throughput, the impact number ratio required for the establishment of a particular degree of reaction must also be higher.

The amount of reaction gas that is withdrawn unconsumed is necessarily also accompanied by a reduction of the suction capacity of the vacuum pumping system, and it has been observed that not only a high process stability but also a higher degree of reaction than formerly has been thus achieved.

It is thus brought about that the reaction gas has to flow from the inlet point in the vicinity of the target almost completely into the area of the dense plasma in front of the target surface and diffuses from there to the substrate, where it is mostly consumed in the chemical reaction before a smaller amount is sucked away through the gap installed at that point. The density of excited reaction gas particles in front of the substrate surface is in this manner decidedly increased. This in turn has the consequence that the necessary impact number ratio for the establishment of the required degree of reaction is lower. Consequently, at the same or even a lower reaction gas flow, a greater amount of metal can be reacted per unit of time at a higher degree of reaction. This also explains that the discharge can be operated in a stable manner by using the process according to the invention, although it might have been expected that the admission of the reaction gas into the vicinity of the target would reduce the basic stability of the discharge, but especially the close coupling between target and substrate would do this.

The invention also relates to an apparatus for performing the process according to the invention in accordance with the general part of claim 10.

The solution of the same problem is achieved by the invention by the features in the specific part of claim 10.

Additional advantageous developments of the subject of the invention will be found in the other subordinate claims.

Embodiments of the invention will be further explained below with the aid of FIGS. 1 to 3.

Figure 2:
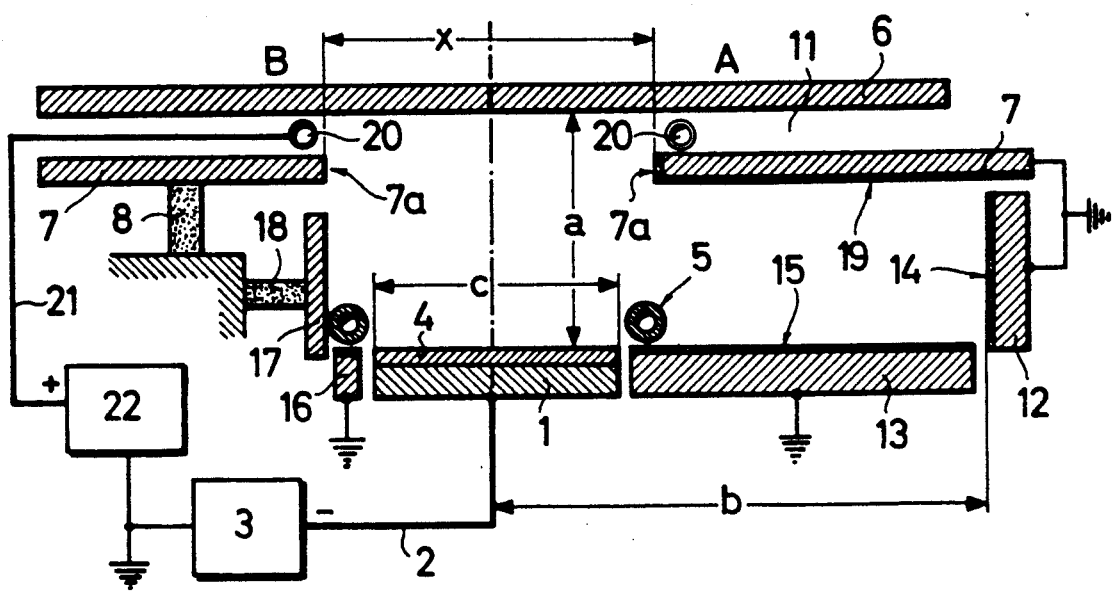
Figure 3:
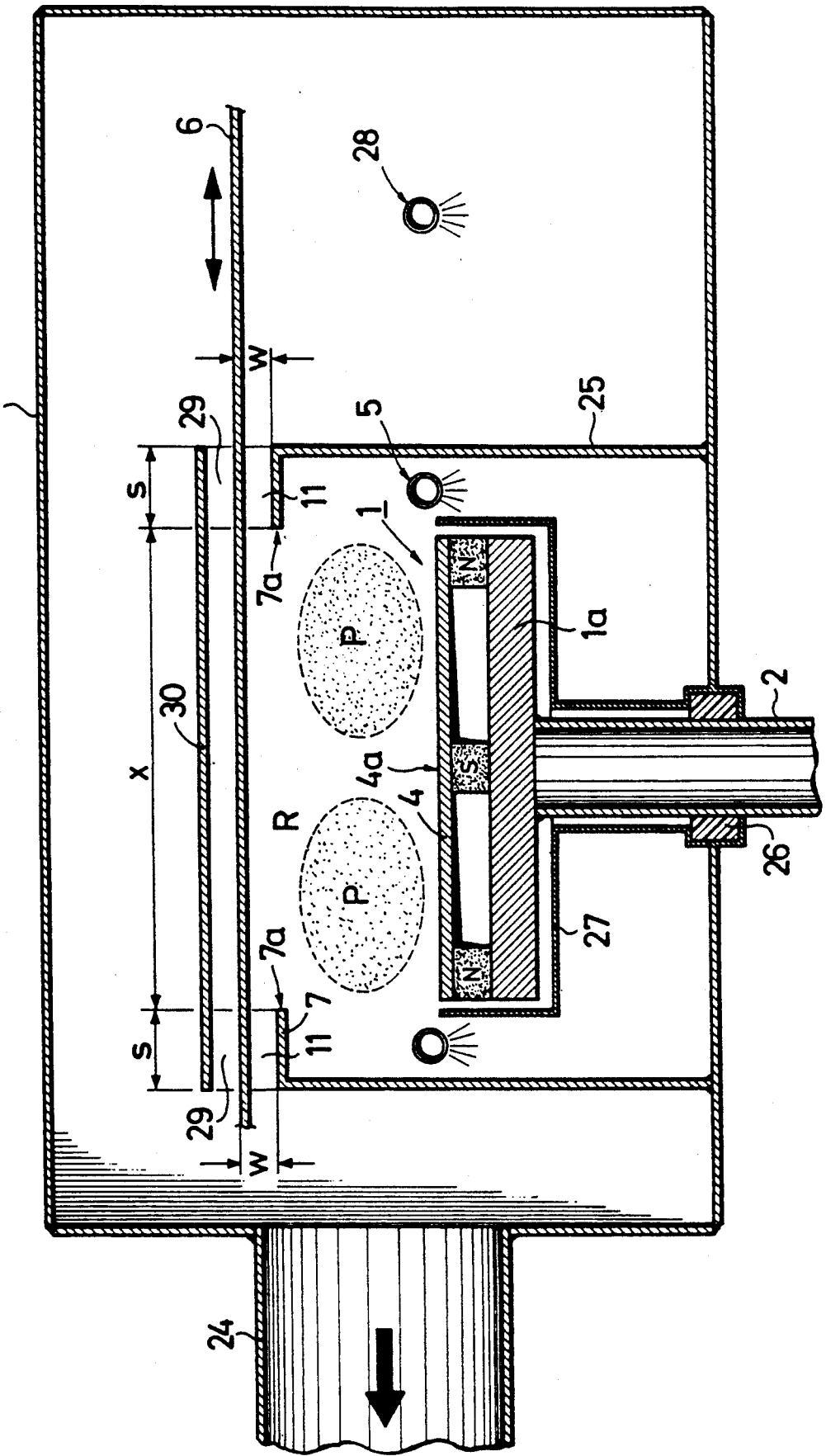

FIG. 1 shows two variants of an apparatus for the production of coatings having a still perceptible conductivity, FIG. 2 shows two variants of an apparatus for the production of coatings which can be considered to be decidedly insulating coatings, FIG. 3 shows a practical embodiment of an apparatus which corresponds essentially to the variant on the right side of FIG. 1.

In FIG. 1 there is shown a magnetron cathode which, in itself, is state of the art. Details of the principles of construction of such a magnetron cathode are also to be seen in FIG. 3. The magnetron cathode 1 is connected by a conductor 2 to a direct-current source 3 which is capable of delivering a negative direct-current voltage between about 400 and 1000 volts. The magnetron cathode is covered by an approximately congruent target 4 of an electrically conductive material which supplies the one component of the coating material that is to be formed. The target has a surface 4a, which is the so-called "sputtering surface."

The magnetron cathode and target 4 are surrounded at the margins by a reaction gas manifold 5, spaced as closely as possible to them without, however, letting the manifold 5 or the target surface 4a overlap one another in plan. The discharge openings of the manifold 4, not further identified, are aimed downwardly. The target 5 has the transverse dimension "c." In the case of a circular target 4, the manifold 5 is represented as an annular conduit, but this is not indicated in the drawing for the sake of simplicity.

In a direction plane-parallel to the target surface 4a, a substrate 6, which is to be coated with the reaction product of the target material and the reaction gas, is moved past the magnetron cathode 1. The distance from the target surface 4a to the substrate 6 is less than 60 mm, "a." This distance is preferably between 40 and 50 mm, while the transverse dimension "c" of the target is not really critical and has the usual dimensions. Within this distance "a," in very close proximity to the substrate 6, a mask 7 is situated, whose inside edges 7a are at a distance "x" from one another, which is between 0.6 times and 2.0 times the transverse dimension "c" of the target 4. The variability of this distance "x" is symbolized by the broken lines prolonging the mask 7.

The mask 7 is disposed in an insulated manner, as indicated by the supporting insulator 8 represented on the left side. It is furthermore connected by a conductor 9 to a direct-current source 10 which is capable of delivering a direct-current voltage between 0 and +200 volts. The mask surface 7b facing the target 4 is at a distance "d" from the substrate 6, which is less than half of the distance "a." In the embodiment the distance "d" is no greater than the sum of the thickness of the mask 7 and the width of a gap 11 of about 5 mm.

On the right-hand part of FIG. 1 (part A) is represented a system in which the magnetron cathode 1 is at a relatively great distance from a wall 12 of the vacuum chamber, which is situated laterally alongside it. The distance is spanned by another wall 13 of the vacuum chamber which as a whole is at ground potential. In the present case the distance of the chamber wall 12 from the central axis of the cathode 1 is "b" and this amounts to b=2c. In this arrangement the chamber walls 12 and 13 become coated with layers 14 and 15 of at least partially insulating material, so that after the initial state the chamber walls gradually lose their anodic function.

In the left part of FIG. 1 (part B) the magnetron cathode is represented more compactly, i.e., the wall 16 of the vacuum chamber at ground potential is very much shorter. In order in this case to prevent the potential conditions from changing as the coating progresses, the directly adjacent side wall 17 of the vacuum chamber is suspended on insulation as indicated by a support insulator 18. In this manner the wall 17 can assume a freely selected intermediate potential.

The two variants in FIG. 1 are suitable especially for depositing coatings with a certain residual conductivity, such as $SiO_2$ for example. At the same time the parts acting as anode are either grounded or connected to positive potential above ground potential and are disposed in the direct particle stream in front of the substrate. In this case coatings sufficiently conductive to receive the discharge current are condensed on the parts acting as anode. On the other surfaces insulative coatings can easily form. If zero potential is used on the mask 7 acting as anode, the mask can be shorted the wall 12 (FIG. 2, part A). As a rule, however, the mask 7 acting as anode is separated from the surrounding walls acting as the plasma diaphragm, e.g., when these walls can "float" like the wall 17 because they are hung on insulators (FIG. 1, part B).

The two variants A and B in FIG. 2 are essentially of the same dimensions and arrangement as FIG. 1, so that the same reference numbers have been used. As already explained above, the variants according to FIG. 2, however, are for the production of insulative coatings. In this case an insulative layer 19 condenses on the mask 7 so that the latter, at least after a period of time, can no longer function as an anode. In order in this case to assure the anodic function, a separate anode 20 is disposed behind the mask 7 in the sputtering direction, and is in the form of a tube through which water flows. The anode 20 is connected by a conductor 21 to a direct-current source 22 which can supply the anode with a positive voltage between about 40 and 120 volts. The anode 20 is set back in the gap 11 away from the edges 7a so far that it can be struck only to a very slight extent by insulative particles. The mask 7 is either at ground potential together with the walls 12 and 13 (FIG. 2, part A) or is held by a supporting insulator 8 at a potential that is automatically freely adjustable (FIG. 2, part B). In either case the mask 7 performs a masking function with respect to the separate anode 20.

As it can be seen in FIG. 2, the anode 20 and the mask 7 are both disposed in close proximity to the substrate, such that the portion of the coating material getting to the substrate 6 is virtually unchanged by the mask 7. The potential conditions in the entire plasma space, especially close to the substrate, remain stable in time and space if an insulating layer forms or is already present on the said surfaces. At the same time, however, the said parts must be electrically conductive, since otherwise they would be unable to perform their functions in the area of the cathode, of suppressing unwanted secondary discharges.

To achieve operating conditions that will be stable from the outset, it is also possible to proceed by providing the said surfaces with insulating coatings deliberately, in a kind of forming phase before the actually coating of the substrates.

In the embodiment according to FIG. 3, a vacuum chamber 23 is also represented diagrammatically, which was omitted in FIGS. 1 and 2. This vacuum chamber is connected by a suction line 24 to a set of vacuum pumps which are not shown. Within the vacuum chamber 23 there is an internal housing 25 which encloses the magnetron cathode 1 and the manifold 5 as closely as possible. The cathode 1 with its target 4 is here, however, represented slightly more in detail: here the magnet poles N and S are shown, which produce over the target surface 4a a closed tunnel of lines of force in which the plasma P is contained. The plasma follows the course of the pole faces; in the case of a circular magnetron cathode it is in the form, approximately, of a torus. The magnetron cathode 1 also includes a cathode base 1a. The conduit 2 is in this case in the form of a supporting tube and is brought through the wall of the vacuum chamber 23 by means of a lead-through insulator 26. The side surfaces, back, and the line 2 are surrounded by a dark-space shield 27 which is likewise at ground potential.

The mask 7 is in this case part of the inner housing 25 and is at ground potential with it. Between the inner edges 7a there is formed, in a manner similar to FIGS. 1 and 2, an opening for the coating material, having the dimension "x." Between the mask 7 and the substrate 6, however, there is formed on the circumference of the inner housing 25 a circumferential gap 11 with a defined width w and a defined length s. This results in a kind of throttling effect, but one which permits gas exchange by flow and diffusion. Through the manifold 5 either a pure reaction gas or a reaction gas mixed with a working gas (argon) can be delivered. Outside of the inner housing 25, but within the vacuum chamber 23 there is another manifold 28 by which pure gas (argon), for example, is delivered.

The inner housing 25 defines a reaction zone R between target 4 and substrate 6 (similarly to the wall 17 in FIGS. 1 and 2), and a state of equilibrium of the gas movements is achieved by the gap 11 such that less than one-third, preferably less than one-fifth, of the unconsumed reaction gas can be withdrawn from the reaction zone R through the suction tube 24. The gap 29 on the back of the substrate 6 is less critical. It is defined by a plate 30, but becomes significant in the plasma process when the substrate 6 consists, for example, of a series of individual plate-like substrates which are carried with spaces between them through the reaction zone R.

By the measures described above it is brought about that the reaction gas flows from the manifold 5 in the vicinity of the target virtually entirely into the area of the dense plasma in front of the target surface and diffuses from there to the substrate where for the most part it is consumed in the chemical reaction. Only the above-mentioned residual amount is aspirated away through the gap 11 there present. In this manner excited reaction gas is prevented from being aspirated directly by the vacuum pumps and thus escaping reaction to chemical compounds on the substrate. In this manner the density of excited reaction gas particles is increased in front of the substrate surface. This in turn reduces the impact ratio necessary for the establishment of the required reactivity.

As shown in FIG. 3, the measures for the establishment of particular flow ratios consist in the selection of certain gap widths and/or gap lengths between the substrate 6 and the inner housing 25 on the one hand, and also in the selection of an effective suction capacity of the vacuum pumps at the suction line 24.

Two cases are to be distinguished: In addition to the reaction gas, the working gas (argon) is also admitted into the inner housing 25, or the reaction gas alone is admitted to the said housing. In the first case the flow rate which is determined by the dimension of the gap 11, as the sum of the flow rates of reaction gas and working gas at a selected total pressure in the inner housing 25, must be adapted to the effective suction capacity of the vacuum pump through the total pressure in the vacuum chamber 23. In the second case the working gas is admitted into the vacuum chamber 23 through the manifold 28 and diffuses into the inner housing 25 in which the reaction process takes place. The gap 11 is in this case to be made of a size that will be essentially adapted to the reaction gas flow that is to be aspirated. Both cases, however, have it in common that the partial pressure difference between the inner housing 25 and the space in the vacuum chamber 23 is kept small in order to produce only a low flow of reaction gas through the gap 11.

EXAMPLE

In an apparatus according to FIG. 3, the effective suction capacity was set at 100 liters per second. The magnetron cathode had a length of 500 mm and was supplied with a stabilized power supply of 1000 W. The total pressure in the vacuum chamber 23 amounted to $4 \times 10^{-3}$, and the distance "a" between target surface and substrate was 40 mm. In this case a flow of 350 sccm of pure oxygen was admitted into the inner housing 25 through the manifold 5 and a flow of 250 sccm of argon was admitted through the manifold 28. The pressure difference produced on both sides of the gap 11 amounted to $1.7 \times 10^{-3}$ mbar.

The holding and guiding system for the substrates is not shown in detail in FIGS. 1 to 3. This involves a substrate holder rotating about an axis but otherwise fixedly mounted, or a plate-like or frame-like substrate holder which can run on rollers or rails within the vacuum chamber. Especially for the production of insulative coatings it is necessary that the substrate holder be at a floating potential. In the case of such coatings a substrate holder at ground potential would greatly influence the potential conditions in the surroundings of the cathode, since conductive surfaces in this space could affect the effectiveness of the anode and thus might produce coating irregularities and arcing. But even for electrically conductive coating, the floating potential of the substrate holder is no disadvantage in any case.

I claim:

1. Process for sputtering electrically resistive coatings onto substantially planar substrates by cathode sputtering by means of a magnetron cathode supplied with direct current, in a vacuum and in a reactive atmosphere with the continuous delivery of reaction gas, said cathode including a target having a planar target surface, the substrates being held or carried plane-parallel to the target surface, a masking system being situated between the planes of the target surface and the substrate and having a potential that is either positive with respect to the cathode potential or is self-establishing, comprising the steps of:
    (a) delivering the reaction gas as close as possible to the target surface, but outside of its outline as seen in plan view,
    (b) maintaining the distance "a" between target surface and substrate surface at less than 60 mm, and,
    (c) selecting a distance "d" between the substrate and the surface of the mask system facing the target that is smaller than half of the distance "a", whereby,
    the reaction gas and the target, and the target and the substrate, respectively, are to a large extent coupled.

2. Process according to claim 1, further comprising the step of providing a distance "x" between the inner edges of the mask that is between 0.6 times and 2.0 times the transverse dimension "c" of the target.

3. Process according to claim 1, characterized in that the distance "d" corresponds to no more than the sum of the thickness of the mask and a gap of 5 mm.

4. Process according to claim 1, further comprising the step of providing a potential on the mask such that at least 70% of the discharge current is fed through the mask.

5. Process according to claim 1, further comprising the step of providing a potential on an additional anode lying behind the mask in the sputtering direction such that at least 70% of the discharge current is fed through the anode.

6. Process according to claim 5, characterized in that the mask is grounded to ground potential.

7. Process according to claim 5, characterized in that the mask has a floating potential.

8. Process according to claim 1, further comprising the step of adjusting the suction capacity of a vacuum pumping system that determines the vacuum on the one hand and adjusting the amount of reaction gas delivered per unit of time on the other hand so that less than one-third of the delivered reaction gas is withdrawn unconsumed from the reaction zone between target and substrate.

9. Process according to claim 1, further comprising the step of selecting the dimensions of a gap between the substrate and an inner housing surrounding the cathode that determines the ratio of delivered to unconsumed and removed reaction gas.

10. The process according to claim 1, characterized in that the distance "a" is between 40 and 50 mm.

11. The process according to claim 1, further comprising the step of adjusting the suction capacity of a vacuum pumping system that determines the vacuum on the one hand and adjusting the amount of reaction gas delivered per unit of time on the other hand so that less than one-fifth of the delivered reaction gas is withdrawn unconsumed from the reaction zone between target and substrate.

12. Apparatus for sputtering electrically resistive coatings onto substantially planar substrates by cathode sputtering, said apparatus having a vacuum chamber, a magnetron cathode supplied with direct current and bearing a planar target surface, a substrate holding or guiding means adapted to hold and carry a substrate plane-parallel to the target surface, a mask disposed between the planes of the target surface and the substrate and provided with a predeterminable or floating potential, and a reaction gas feeding and distributing system having outlets for continuous delivery of reaction gas wherein:
(a) the outlets of the distributing system for the reaction gas are disposed as close as possible to the target surface but outside of the its outline, seen in plan view,
(b) the distance "a" between target surface and substrate surface is less than 60 mm, and
(c) the distance "d" between the substrate and the surface of the mask facing the target is less than half of the distance "a", whereby, the reaction gas and the target, and the target and the substrate, respectively, are to a large extent coupled.

13. Apparatus according to claim 12, characterized in that the distance "d" corresponds to no more than the sum of the thickness of the mask (7) and a gap of 5 mm.

14. Apparatus according to claim 12, characterized in that the distance "x" between the inner edges (7a) of the mask (7) is between 0.6 times and 2.0 times the transverse dimension "c" of the target (4).

15. Apparatus according to claim 12, characterized in that a reaction zone (R) between target (4) and substrate (6), including the outlets (5) for the reaction gas, is surrounded by an inner housing (25) disposed within the vacuum chamber (23), and connected to the interior of the vacuum chamber by at least one gap (11) defined on one side by the substrate (6), the gap being of such dimensions that less than one-third of the unconsumed reaction gas can be withdrawn from the reaction zone.

16. The apparatus according to claim 12, characterized in that the distance "a" is between 40 and 50 mm.

17. The apparatus according to claim 12, characterized in that a reaction zone (R) between target (4) and substrate (6), including the outlets (5) for the reaction gas, is surrounded by an inner housing (25) disposed within the vacuum chamber (23), and connected to the interior of the vacuum chamber by at least one gap (11) defined on one side by the substate (6), the gap being of such dimensions that less than one-fifth of the unconsumed reaction gas can be withdrawn from the reaction zone.

18. The apparatus according to claim 12 characterized in that said mask is adapted to have a potential such that at least 70% the discharge current is fed through the mask.

19. The apparatus according to claim 12 further comprising an additional anode lying behind the mask in the sputtering direction, said anode being adapted to have a potential such that at least 70% of the discharge current is fed through the anode.

20. The apparatus according to claim 12 characterized in that said mask is adapted to be grounded.

21. The apparatus according to claim 12 characterized in that said mask is adapted to have a floating potential.

22. The apparatus according to claim 12 further comprising a vacuum pumping system adapted to provide a vacuum such that less than one-third of the delivered reaction gas is withdrawn unconsumed from the reaction zone between the target and the substrate.

23. The apparatus according to claim 12 further comprising a vacuum pumping system adapted to provide a vacuum such that less than one-fifth of the delivered reaction gas is withdrawn unconsumed from the reaction zone between the target and the substrate.

* * * * *